(12) United States Patent
Bathan et al.

(10) Patent No.: US 8,241,965 B2
(45) Date of Patent: Aug. 14, 2012

(54) INTEGRATED CIRCUIT PACKAGING SYSTEM WITH PAD CONNECTION AND METHOD OF MANUFACTURE THEREOF

(75) Inventors: Henry Descalzo Bathan, Singapore (SG); Flynn Carson, Redwood City, CA (US); Zigmund Ramirez Camacho, Singapore (SG); Emmanuel Espiritu, Singapore (SG)

(73) Assignee: Stats Chippac Ltd., Singapore (SG)

( * ) Notice: Subject to any disclaimer, the term of this patent is extended or adjusted under 35 U.S.C. 154(b) by 57 days.

(21) Appl. No.: 12/859,049

(22) Filed: Aug. 18, 2010

(65) Prior Publication Data
US 2011/0079886 A1    Apr. 7, 2011

Related U.S. Application Data

(60) Provisional application No. 61/247,566, filed on Oct. 1, 2009.

(51) Int. Cl.
*H01L 21/00* (2006.01)
(52) U.S. Cl. ........ 438/123; 438/106; 438/121; 257/676; 257/E21.506; 257/E21.001; 257/E23.031

(58) Field of Classification Search .................. 257/676, 257/E21.506, E23.031, E21.001; 438/123
See application file for complete search history.

(56) References Cited

U.S. PATENT DOCUMENTS

| | | | |
|---|---|---|---|
| 7,009,286 B1 * | 3/2006 | Kirloskar et al. ............. | 257/684 |
| 7,049,177 B1 | 5/2006 | Fan et al. | |
| 8,058,720 B2 * | 11/2011 | Chen et al. ..................... | 257/691 |
| 2002/0084518 A1 * | 7/2002 | Hasebe et al. ................ | 257/676 |
| 2005/0263863 A1 * | 12/2005 | Sasaki et al. .................. | 257/676 |
| 2007/0059863 A1 | 3/2007 | Li et al. | |
| 2007/0181983 A1 | 8/2007 | Takai et al. | |
| 2010/0258921 A1 * | 10/2010 | Chang Chien et al. ....... | 257/676 |

* cited by examiner

*Primary Examiner* — Angel Roman
(74) *Attorney, Agent, or Firm* — Ishimaru & Associates LLP; Mikio Ishimaru; Stanley M. Chang

(57) ABSTRACT

A method of manufacture of an integrated circuit packaging system includes: providing a package paddle; forming a pad extension having a spacing to the package paddle; forming a lead adjacent the pad extension, the pad extension between the package paddle and the lead; forming a conductive layer directly on and between the package paddle and the pad extension; and connecting an integrated circuit to the pad extension and the lead, the integrated circuit over the package paddle.

20 Claims, 3 Drawing Sheets

INTEGRATED CIRCUIT PACKAGING SYSTEM WITH PAD CONNECTION AND METHOD OF MANUFACTURE THEREOF

CROSS-REFERENCE TO RELATED APPLICATION(S)

This application claims the benefit of U.S. Provisional Patent Application Ser. No. 61/247,566 filed Oct. 1, 2009, and the subject matter thereof is incorporated herein by reference thereto.

TECHNICAL FIELD

The present invention relates generally to an integrated circuit packaging system, and more particularly to a system for connection.

BACKGROUND ART

Semiconductor chips have become progressively more complex, driven in large part by the need for increasing processing power in a smaller chip size for compact or portable electronic devices such as cell phones, smart phones, personal media systems, ultraportable computers.

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections.

In general, the die and portions of the leadframe are encapsulated with a molding material to protect the delicate electrical components on the active side of the die while leaving selected portions of the leadframe exposed to facilitate electrical connection to external devices.

In response to the smaller chip size, packaging technologies have evolved, for example, to enable an increased lead density, which can reduce the footprint area of a package mounted on a printed circuit board (PCB). Some packaging technologies may enable this increased lead density by providing rows of leads connected to a disposable portion of a leadframe.

However, manufacturing processes for such leadframes may not be scalable. As lead density requirements further increase, it may be desirable to use packaging technologies that are more scalable in terms of lead density.

Moreover, it may be desirable to further reduce package size in additional ways. At the same time, it may be desirable to maintain sufficient structural integrity and to facilitate surface mounting of the package to a PCB. It may also be desirable to formulate a packaging process designed to meet these objectives. Current packaging solutions can meet some of these objectives but may not be able to meet most, or all, of these objectives.

Thus, a need still remains for increased density and structural integrity. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package paddle; forming a pad extension having a spacing to the package paddle; forming a lead adjacent the pad extension, the pad extension between the package paddle and the lead; forming a conductive layer directly on and between the package paddle and the pad extension; and connecting an integrated circuit to the pad extension and the lead, the integrated circuit over the package paddle.

The present invention provides an integrated circuit packaging system, including: a package paddle; a pad extension having a spacing to the package paddle; a lead adjacent the pad extension, the pad extension between the package paddle and the lead; a conductive layer directly on and between the package paddle and the pad extension; and an integrated circuit connected to the pad extension and the lead, the integrated circuit over the package paddle.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
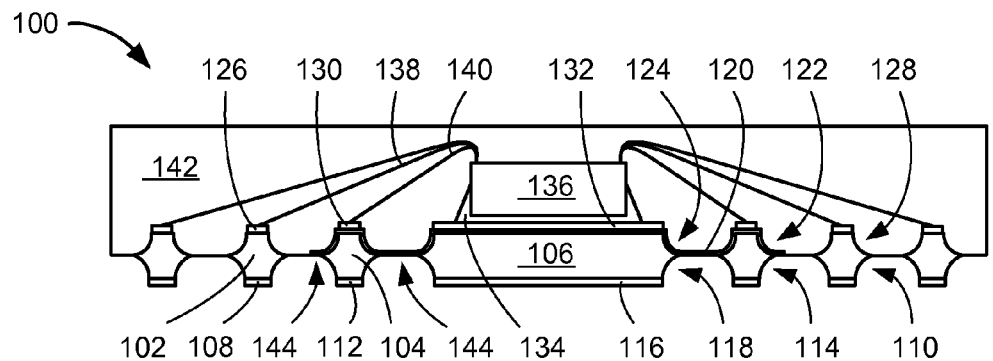
FIG. 1 is a cross-sectional view of an integrated circuit packaging system along a section line 1-1 of FIG. 2 in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Current methods are not able to provide an ideal surface mount technology (SMT) performance. For example, a problem associated with a solder creep on an exposed copper is not good because it closes an intended gap between leads, leads and pads, or pads and a die attach paddle and does not promote uniform solder collapse and distribution upon reflow. The present invention solves the problem associated with the solder creep.

Figure 2:
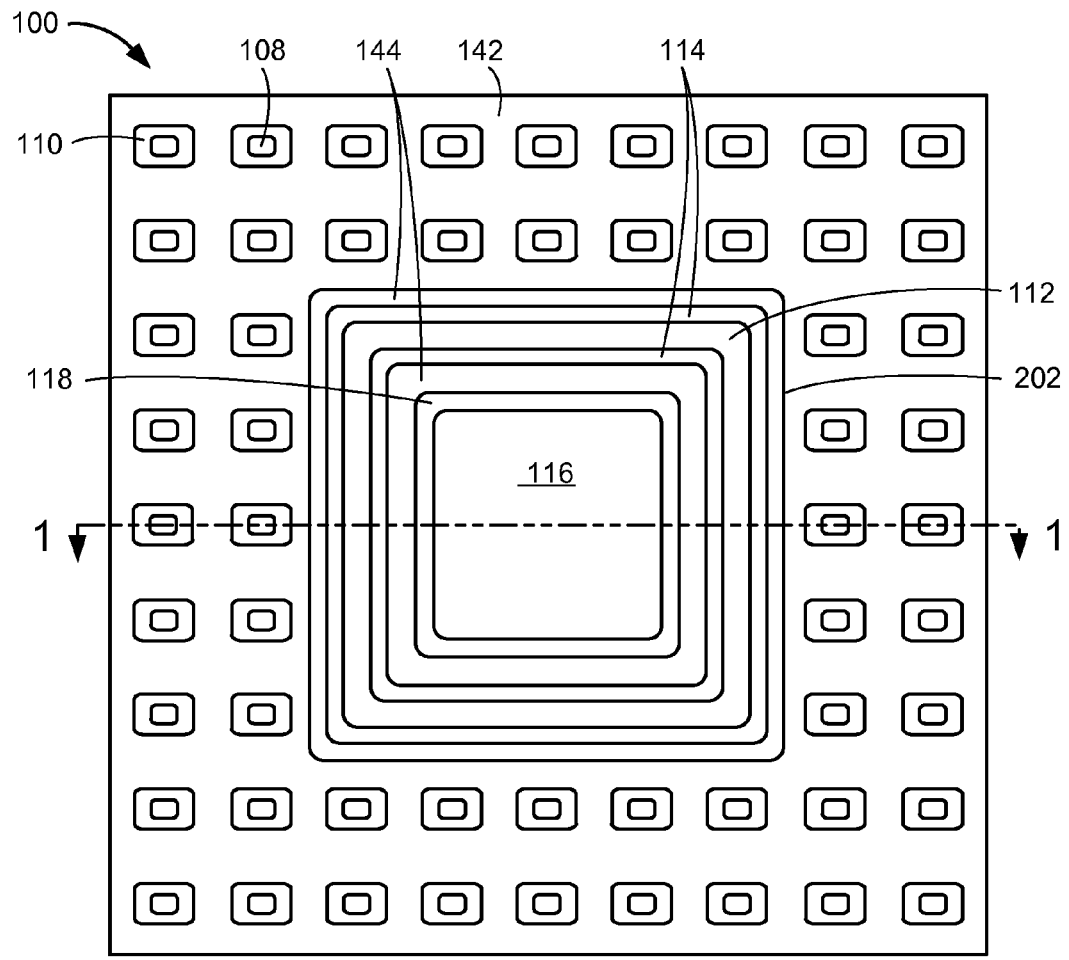
FIG. 2 is a bottom view of the integrated circuit packaging system.

Referring now to FIG. 1, therein is shown a cross-sectional view of an integrated circuit packaging system 100 along a section line 1-1 of FIG. 2 in an embodiment of the present invention. The integrated circuit packaging system 100 can include a lead 102, which provides electrical connectivity to external systems.

The integrated circuit packaging system 100 can include a pad extension 104, which provides a connection region for electrical levels such as power or ground. The pad extension 104, such as a power bar or a ground bar, can provide a connection region for electrical levels, such as power or ground.

The pad extension 104 can be adjacent the lead 102. The pad extension 104 can be between the lead 102 and a package paddle 106, which is used to mount an electrical device. The pad extension 104 can have a spacing to the package paddle 106. The pad extension 104 is structurally isolated from the package paddle 106 such that the pad extension 104 and the package paddle 106 are physically separated from each other. For example, the package paddle 106 can be a die attach paddle (DAP).

The integrated circuit packaging system 100 can include a lead external layer 108, which provides an electrical connection to the external systems. The lead external layer 108 can be formed directly on the lead 102. The lead external layer 108 can be under and connected to a lead bottom portion 110 of the lead 102.

The integrated circuit packaging system 100 can include a pad external layer 112, which provides an electrical connection to the external systems. The pad external layer 112 can be formed directly on the pad extension 104. The pad external layer 112 can be under and connected to a pad bottom portion 114 of the pad extension 104.

The integrated circuit packaging system 100 can include a paddle external layer 116, which provides an electrical connection to the external systems. The paddle external layer 116 can be formed directly on the package paddle 106. The paddle external layer 116 can be under and connected to a paddle bottom portion 118 of the package paddle 106.

The integrated circuit packaging system 100 can include a conductive layer 120, which is an electrically conductive material. The conductive layer 120 can have a material that is characteristically resistant to solder flow. The conductive layer 120 can have a material that is un-etched by an etchant used during a strip etch process. For example, the conductive layer 120 can be a layer of selective silver (Ag), pure nickel (Ni), a metallic material, or any other electrically conductive material.

The conductive layer 120 can partially cover the pad extension 104 and the package paddle 106. The conductive layer 120 can be formed directly on a pad top portion 122 of the pad extension 104 and a paddle top portion 124 of the package paddle 106. The pad top portion 122 and the paddle top portion 124 are over the pad bottom portion 114 and the paddle bottom portion 118, respectively.

The conductive layer 120 can horizontally extend beyond the pad extension 104 towards the lead 102 that is adjacent the pad extension 104. The conductive layer 120 can be formed between the pad extension 104 and the package paddle 106. The conductive layer 120 can electrically connect the pad extension 104 and the package paddle 106 for providing the same electrical level, such as the same power level or the same ground level, to the pad extension 104 and the package paddle 106.

The integrated circuit packaging system 100 can include a lead internal layer 126, which provides an electrical contact for connecting the electrical device thereto. The lead internal layer 126 can be formed directly on and electrically connected to a lead top portion 128 of the lead 102. The lead top portion 128 is over the lead bottom portion 110.

The integrated circuit packaging system 100 can include a pad internal layer 130, which provides an electrical contact for connecting the electrical device thereto. The pad internal layer 130 can be formed directly on and electrically connected to a top portion of the conductive layer 120. The top portion of the conductive layer 120 can be directly on and electrically connected to the pad top portion 122.

The integrated circuit packaging system 100 can include a paddle internal layer 132, which is a layer for mounting the electrical device thereover. The paddle internal layer 132 can be formed directly on and electrically connected to another of the top portion of the conductive layer 120. The another of the top portion of the conductive layer 120 can be directly on and electrically connected to the paddle top portion 124.

The integrated circuit packaging system 100 can include an attach layer 134, which is a die attach material or an adhesive material. The attach layer 134 can be attached to the paddle internal layer 132 and an integrated circuit 136, which is the electrical device.

The integrated circuit 136 can be mounted over the paddle internal layer 132. For example, the integrated circuit 136 can be a wirebond integrated circuit, an integrated circuit die, or a chip.

The integrated circuit packaging system 100 can include a lead-device connector 138, which electrically connects the lead 102 and the integrated circuit 136. The lead-device connector 138 can be connected to the lead internal layer 126 and the integrated circuit 136. For illustrative purposes, the lead-device connector 138 is shown as a bond wire, although it is understood that the lead-device connector 138 can be any conductive connector.

The integrated circuit packaging system 100 can include a pad-device connector 140, which electrically connects the pad extension 104 and the integrated circuit 136. The pad-device connector 140 can be connected to the pad internal layer 130 and the integrated circuit 136. For illustrative purposes, the pad-device connector 140 is shown as a bond wire, although it is understood that the pad-device connector 140 can be any conductive connector.

The integrated circuit packaging system 100 can include an encapsulation 142, which covers a semiconductor package to seal electrical devices providing mechanical and environmental protection. The encapsulation 142 can be a cover including an encapsulant or a mold material.

The encapsulation 142 can be formed over the lead 102, the pad extension 104, the package paddle 106, and the conductive layer 120. The encapsulation 142 can cover the integrated circuit 136, the lead-device connector 138, and the pad-device connector 140.

The encapsulation 142 can partially cover the lead 102 and the conductive layer 120. The encapsulation 142 can cover the lead top portion 128 and a top surface of the conductive layer 120. The lead bottom portion 110, the pad bottom portion 114, the paddle bottom portion 118, the lead external layer 108, the pad external layer 112, and the paddle external layer 116 can be exposed from the encapsulation 142.

The encapsulation 142 can partially expose the conductive layer 120. The encapsulation 142 can expose a conductive bottom portion 144 of the conductive layer 120. The encapsulation 142 can expose a bottom surface of the conductive bottom portion 144. The bottom surface extends between the pad extension 104 and the package paddle 106.

The invention can include a stand-off quad flat nolead (QFN) package configured for efficient surface mount technology (SMT). For example, the stand-off QFN (QFN-st) can include the package paddle 106 and the pad extension 104 that are connected and partially covered by the conductive layer 120.

The present invention can also include a quad flat nolead sawn stand-off multiple row package (QFNs-st-mr), a quad flat nolead sawn strip etch (QFNs-se), or a stand-off quad flat nolead (QFN) with solder resistant pad extension connection or power bar connection.

It has been discovered that the present invention provides the conductive layer 120 that is characteristically resistant to solder to prevent any creeping of solder. It has been unexpectedly found that during surface mounting, the conductive layer 120 is intended to resist solder flow, hence preventing any creeping of solder. The ideal surface mount technology (SMT) performance includes no solder creep up.

Referring now to FIG. 2, therein is shown a bottom view of the integrated circuit packaging system 100. A number of the lead bottom portion 110 can be formed in a peripheral array adjacent a periphery of the encapsulation 142. The number of the lead bottom portion 110 can be formed surrounding the pad bottom portion 114.

The pad bottom portion 114 can be formed surrounding the paddle bottom portion 118. The pad bottom portion 114 can be between the lead bottom portion 110 and the paddle bottom portion 118. The lead external layer 108, the pad external layer 112, and the paddle external layer 116 can be formed directly on the lead bottom portion 110, the pad bottom portion 114, and the paddle bottom portion 118, respectively.

The conductive bottom portion 144 can be partially exposed from the encapsulation 142. The conductive bottom portion 144 can have a conductive boundary 202 surrounding the pad bottom portion 114. The conductive boundary 202 can be between the peripheral array of the lead bottom portion 110 and the pad bottom portion 114.

For illustrative purposes, the lead external layer 108 and the lead bottom portion 110 are shown with each having a shape of a rectangle although it is understood that the lead external layer 108 and the lead bottom portion 110 can have any shape.

Further, for illustrative purposes, the pad external layer 112, the pad bottom portion 114, and the conductive bottom portion 144 are shown with each having a contiguous shape of a ring although it is understood that the pad external layer 112, the pad bottom portion 114, and the conductive bottom portion 144 can be formed in any shape that is non-contiguous including having multiple sections, shapes, or regions. The ring is formed with multiple connected sides surrounding the paddle bottom portion 118 with each of the connected sides having a contiguous shape of a bar.

Figure 3:
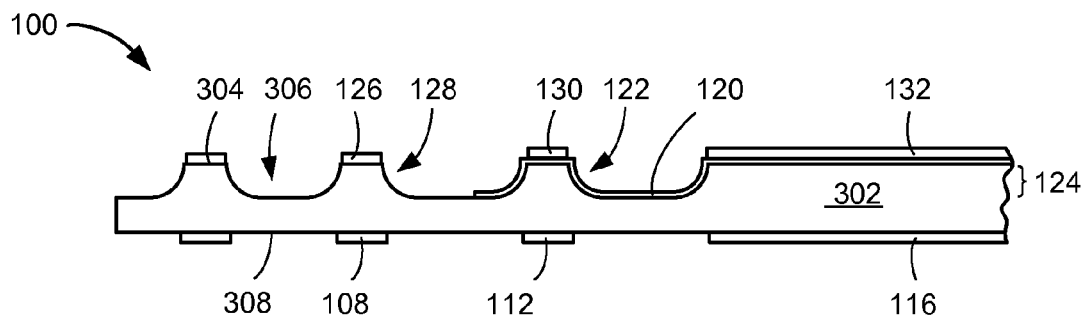
FIG. 3 is a cross-sectional view of a portion of the integrated circuit packaging system along the section line 1-1 of FIG. 2 in a plating phase of manufacture.

Referring now to FIG. 3, therein is shown a cross-sectional view of a portion of the integrated circuit packaging system 100 along the section line 1-1 of FIG. 2 in a plating phase of manufacture. A leadframe 302 preferably includes a top side 304. Portions of the leadframe 302 at the top side 304 can be removed to form partially removed regions 306. The leadframe 302 preferably includes the partially removed regions 306 defining the lead top portion 128, the pad top portion 122, or the paddle top portion 124.

For example, the leadframe 302 can include copper (Cu), any other metallic material, or any electrically conductive material. Also for example, the integrated circuit packaging system 100 can include an etching process or a removal process to remove upper portions of the leadframe 302 at the top side 304 to form the partially removed regions 306.

The lead external layer 108, the pad external layer 112, and the paddle external layer 116 can be formed by a pre-plated leadframe (PPF) plating process for providing electrical connections to the external systems. The lead external layer 108, the pad external layer 112, and the paddle external layer 116 can be under the lead top portion 128, the pad top portion 122, and the paddle top portion 124, respectively.

The lead external layer 108, the pad external layer 112, and the paddle external layer 116 can be formed directly on and below a bottom side 308 of the leadframe 302. The bottom side 308 is a side opposite to the top side 304.

The conductive layer 120 can be formed by a plating process. The conductive layer 120 can be formed with selective silver (Ag), pure nickel (Ni), or any electrically conductive material that characteristically resists solder flow. The conductive layer 120 can be formed directly on the pad top portion 122 and the paddle top portion 124.

The conductive layer 120 can be formed to conform to portions of the partially removed regions 306. The conductive layer 120 can be partially formed directly on one of the partially removed regions 306. The one of the partially removed regions 306 is between the lead top portion 128 and the pad top portion 122.

The conductive layer 120 can be formed directly on another of the partially removed regions 306. The another of the partially removed regions 306 is between the pad top portion 122 and the paddle top portion 124.

The lead internal layer 126, the pad internal layer 130, and the paddle internal layer 132 can be formed by a pre-plated leadframe (PPF) plating process. The lead internal layer 126 and the pad internal layer 130 can be formed for providing electrical connections thereto. The paddle internal layer 132 can be formed for mounting the electrical device thereon.

The lead internal layer 126 can be formed directly on the lead top portion 128. The pad internal layer 130 can be formed directly on the top portion of the conductive layer 120. The paddle internal layer 132 can be formed directly on the another of the top portion of the conductive layer 120.

Figure 4:
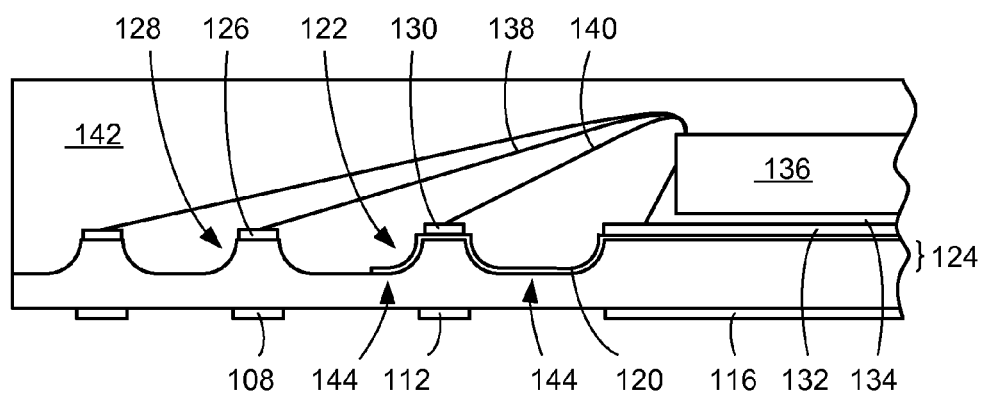
FIG. 4 is the structure of FIG. 3 in a molding phase.

Referring now to FIG. 4, therein is shown the structure of FIG. 3 in a molding phase. The integrated circuit 136 can be mounted over the paddle top portion 124.

The integrated circuit 136 can be attached to the paddle internal layer 132 with a die attach process (DA) or any other attachment process. The attach layer 134 can be attached to the paddle internal layer 132 and the integrated circuit 136.

The integrated circuit 136 can be connected to the lead internal layer 126 with a wire bond process (WB) or any other interconnection process. The lead-device connector 138 can be connected to the lead internal layer 126 and the integrated circuit 136.

The integrated circuit 136 can be connected to the pad internal layer 130 with a wire bond process (WB) or any other interconnection process. The pad-device connector 140 can be connected to the pad internal layer 130 and the integrated circuit 136.

The encapsulation 142 can be formed with a mold process (MOLD) or any other encapsulation process. The encapsulation 142 can be formed over the lead top portion 128, the pad top portion 122, and the paddle top portion 124.

The encapsulation 142 can cover the lead top portion 128, the top surface of the conductive layer 120, the lead internal layer 126, the pad internal layer 130, the paddle internal layer 132, the attach layer 134, the integrated circuit 136, the lead-device connector 138, and the pad-device connector 140. The encapsulation 142 can expose the lead external layer 108, the pad external layer 112, and the paddle external layer 116.

Figure 5:
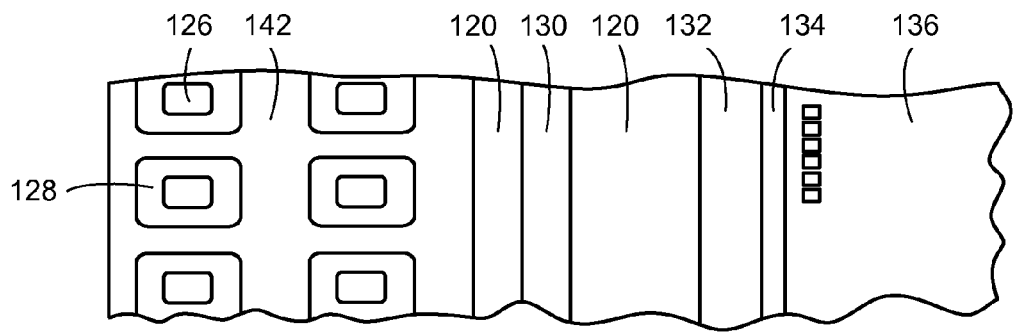
FIG. 5 is a top view of the structure of FIG. 4.

Referring now to FIG. 5, therein is shown a top view of the structure of FIG. 4. The top view is depicted as if in an x-ray top view. The top view is shown without the lead-device connector 138 of FIG. 1, the pad-device connector 140 of FIG. 1, and the encapsulation 142.

For illustrative purposes, the lead internal layer 126 and the lead top portion 128 are shown with each having a shape of a rectangle although it is understood that the lead internal layer 126 and the lead top portion 128 can have any shape. Further, for illustrative purposes, the conductive layer 120 and the pad internal layer 130 are shown with each having a contiguous shape of a bar although it is understood that the conductive layer 120 and the pad internal layer 130 can be formed in any shape including having multiple sections, shapes, or regions.

The integrated circuit 136 can be attached to the paddle internal layer 132 with the attach layer 134. The integrated circuit 136 can include contacts, which are pads to which the lead-device connector 138 and the pad-device connector 140 are connected.

Figure 6:
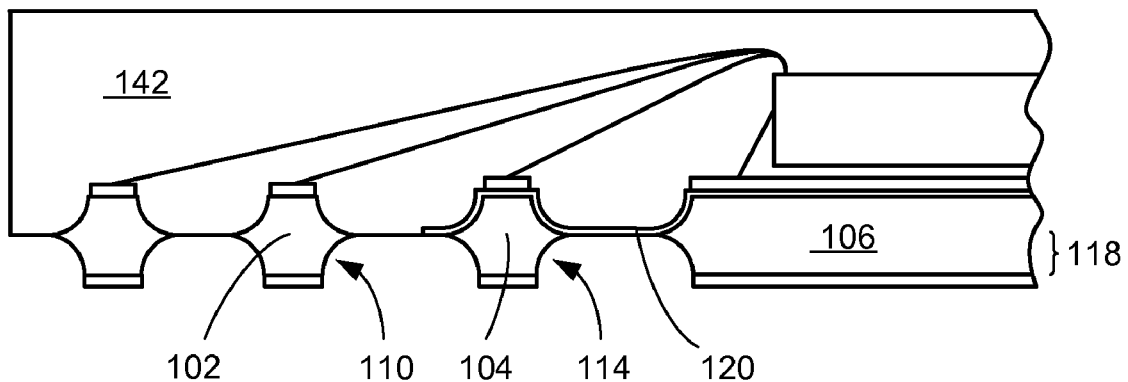
FIG. 6 is the structure of FIG. 4 in a removal phase.

Referring now to FIG. 6, therein is shown the structure of FIG. 4 in a removal phase. The removal phase can include an etch process, a strip etch process, or any other removal process to singulate or electrically isolate the lead 102, the pad extension 104, or the package paddle 106.

The conductive layer 120 can be partially exposed after the removal process. The conductive layer 120 can be selectively un-etched by an etchant used during the removal process. The term "un-etched" means that the etchant does not remove the conductive layer 120.

For example, the etchant can be used to remove lower portions of the leadframe 302 of FIG. 3 defining the lead bottom portion 110, the pad bottom portion 114, and the paddle bottom portion 118. Also for example, the etchant can include a copper etchant or any other etchant that can be used remove the lower portions of the leadframe 302.

The lead bottom portion 110, the pad bottom portion 114, and the paddle bottom portion 118 can be exposed from the encapsulation 142. After the removal process, the lead 102, the pad extension 104, and the package paddle 106 can include ridges, which are portions of the lead 102, the pad extension 104, and the package paddle 106, respectively. The ridges outwardly extend from sides of the lead 102, the pad extension 104, and the package paddle 106.

It has been discovered that the conductive layer 120 of the electrically conductive material is un-etched by the etchant. It has been unexpectedly found that therefore the conductive layer 120 maintains an electrical connection between the pad extension 104 and the package paddle 106 for providing the same electrical level to the pad extension 104 and the package paddle 106. It has been unexpectedly observed that at the same time, the conductive layer 120 is able to resist solder creep during a surface mounting process.

Figure 7:
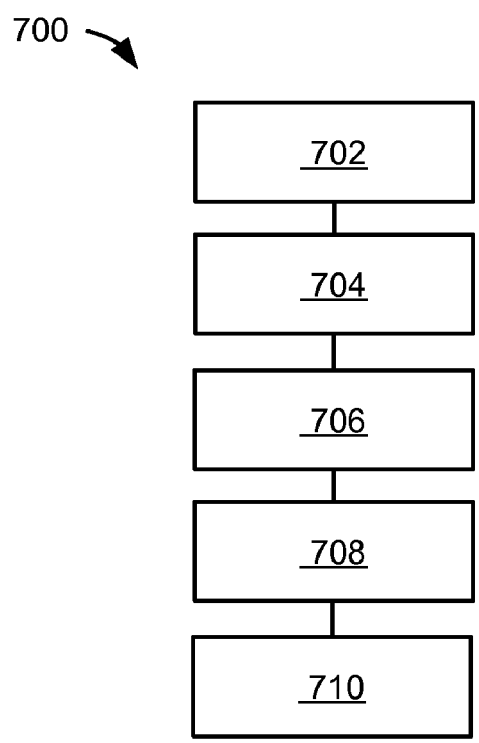
FIG. 7 is a flow chart of a method of manufacture of the integrated circuit packaging system in a further embodiment of the present invention.

Referring now to FIG. 7, therein is shown a flow chart of a method 700 of manufacture of the integrated circuit packaging system 100 in a further embodiment of the present invention. The method 700 includes: providing a package paddle in a block 702; forming a pad extension having a spacing to the package paddle in a block 704; forming a lead adjacent the pad extension, the pad extension between the package paddle and the lead in a block 706; forming a conductive layer directly on and between the package paddle and the pad extension in a block 708; and connecting an integrated circuit to the pad extension and the lead, the integrated circuit over the package paddle in a block 710.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacture of an integrated circuit packaging system comprising:
   providing a package paddle;

forming a pad extension structurally isolated from the package paddle;

forming a lead adjacent the pad extension, the pad extension between the package paddle and the lead;

forming a conductive layer directly on and between the package paddle and the pad extension; and connecting an integrated circuit to the pad extension and the lead, the integrated circuit over the package paddle.

2. The method as claimed in claim 1 wherein forming the conductive layer includes forming the conductive layer electrically connected to the package paddle and the pad extension for providing the same electrical level.

3. The method as claimed in claim 1 wherein forming the conductive layer includes forming the conductive layer having a material resistant to solder flow.

4. The method as claimed in claim 1 further comprising forming a pad internal layer on the conductive layer for providing an electrical contact.

5. The method as claimed in claim 1 wherein forming the conductive layer includes forming the conductive layer having a contiguous shape of a ring surrounding the package paddle.

6. A method of manufacture of an integrated circuit packaging system comprising:

providing a package paddle;

forming a pad extension structurally isolated from the package paddle;

forming a lead adjacent the pad extension, the pad extension between the package paddle and the lead;

forming a conductive layer directly on and between the package paddle and the pad extension;

connecting an integrated circuit to the pad extension and the lead, the integrated circuit over the package paddle; and forming an encapsulation over the conductive layer covering the integrated circuit.

7. The method as claimed in claim 6 wherein forming the conductive layer includes forming the conductive layer electrically connected to the package paddle and the pad extension for providing the same ground level.

8. The method as claimed in claim 6 wherein forming the conductive layer includes forming the conductive layer having a material un-etched and resistant to solder flow.

9. The method as claimed in claim 6 further comprising:

forming a pad internal layer on the conductive layer; and connecting a pad-device connector to the pad internal layer and the integrated circuit.

10. The method as claimed in claim 6 wherein forming the conductive layer includes forming a non-contiguous conductive layer.

11. An integrated circuit packaging system comprising:

a package paddle;

a pad extension structurally isolated from the package paddle;

a lead adjacent the pad extension, the pad extension between the package paddle and the lead;

a conductive layer directly on and between the package paddle and the pad extension; and an integrated circuit connected to the pad extension and the lead, the integrated circuit over the package paddle.

12. The system as claimed in claim 11 wherein the conductive layer is electrically connected to the package paddle and the pad extension for providing the same electrical level.

13. The system as claimed in claim 11 wherein the conductive layer has a material resistant to solder.

14. The system as claimed in claim 11 further comprising a pad internal layer on the conductive layer for providing an electrical contact.

15. The system as claimed in claim 11 wherein the conductive layer has a contiguous shape of a ring surrounding the package paddle.

16. The system as claimed in claim 11 further comprising an encapsulation over the conductive layer covering the integrated circuit.

17. The system as claimed in claim 16 wherein the conductive layer is electrically connected to the package paddle and the pad extension for providing the same ground level.

18. The system as claimed in claim 16 wherein the conductive layer has a material un-etched and resistant to solder.

19. The system as claimed in claim 16 further comprising:

a pad internal layer on the conductive layer; and a pad-device connector connected to the pad internal layer and the integrated circuit.

20. The system as claimed in claim 16 wherein the conductive layer is a non-contiguous conductive layer.

* * * * *